(12) United States Patent
Moschner et al.

(10) Patent No.: US 9,461,195 B2
(45) Date of Patent: Oct. 4, 2016

(54) METHOD FOR PRODUCING A SOLAR CELL

(71) Applicant: FRAUNHOFER-GESELLSCHAFT ZUR FORDERUNG DER ANGEWANDTEN FORSCHUNG E.V., Munich (DE)

(72) Inventors: Jens Dirk Moschner, Alzenau (DE); Henning Nagel, Alzenau (DE); Agata Lachowicz, Karlstein (DE); Markus Fiedler, Frankfurt (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 14/380,591

(22) PCT Filed: Feb. 22, 2013

(86) PCT No.: PCT/EP2013/053515
§ 371 (c)(1),
(2) Date: Aug. 26, 2014

(87) PCT Pub. No.: WO2013/124394
PCT Pub. Date: Aug. 29, 2013

(65) Prior Publication Data
US 2015/0064835 A1 Mar. 5, 2015

(30) Foreign Application Priority Data
Feb. 23, 2012 (DE) .................. 10 2012 101 456

(51) Int. Cl.
*H01L 31/02* (2006.01)
*H01L 31/18* (2006.01)
*H01L 31/0216* (2014.01)

(52) U.S. Cl.
CPC ..... *H01L 31/1868* (2013.01); *H01L 31/02167* (2013.01); *H01L 31/02168* (2013.01); *H01L 31/1804* (2013.01); *Y02E 10/50* (2013.01); *Y02P 70/521* (2015.11)

(58) Field of Classification Search
CPC .............. H01L 31/18; H01L 31/186; H01L 31/02167; H01L 31/02168
USPC .......................... 438/71, 72; 257/E21.414
See application file for complete search history.

(56) References Cited

U.S. PATENT DOCUMENTS

| 4,931,308 A | * | 6/1990 | Shimizu et al. .............. 427/564 |
| 2002/0085968 A1 | * | 7/2002 | Smalley et al. .............. 422/198 |

(Continued)

FOREIGN PATENT DOCUMENTS

| DE | 10202103 A1 | 9/2002 |
| DE | 102006046726 A1 | 4/2008 |

(Continued)

OTHER PUBLICATIONS

International Search Report dated Aug. 21, 2013, corresponding to International Patent Application PCT/EP2013/053515.

(Continued)

*Primary Examiner* — Michael Lebentritt
(74) *Attorney, Agent, or Firm* — Ladas & Parry LLP

(57) ABSTRACT

The invention relates to a method for producing a solar cell having a substrate made of silicon, which substrate has a silicon oxide layer present on the surface of the substrate and an antireflection layer applied to the silicon oxide layer, which antireflection layer is deposited onto the dielectric passivation layer in a process chamber. According to the invention, in order to achieve a stability of corresponding solar cells or solar cell modules produced therefrom against a potential induced degradation (PID), the dielectric passivation layer is formed from the surface of the substrate in the process chamber by means of a plasma containing an oxidizing gas.

23 Claims, 2 Drawing Sheets

(56) References Cited

U.S. PATENT DOCUMENTS

| | | | |
|---|---|---|---|
| 2006/0105114 A1* | 5/2006 | White | 427/569 |
| 2007/0134415 A1 | 6/2007 | Hwang et al. | |
| 2009/0260673 A1 | 10/2009 | Swanson et al. | |
| 2009/0280597 A1* | 11/2009 | Wijekoon et al. | 438/71 |
| 2010/0029038 A1 | 2/2010 | Murakawa | |
| 2010/0139740 A1 | 6/2010 | Xavier et al. | |
| 2010/0154883 A1 | 6/2010 | Komatsu et al. | |
| 2010/0275965 A1 | 11/2010 | Lee et al. | |
| 2010/0307562 A1 | 12/2010 | Swanson et al. | |
| 2011/0079250 A1* | 4/2011 | Reinhardt et al. | 134/28 |
| 2011/0240114 A1 | 10/2011 | Stewart et al. | |
| 2013/0022760 A1* | 1/2013 | Debari et al. | 427/575 |
| 2014/0283904 A1* | 9/2014 | Huang et al. | 136/256 |
| 2015/0064835 A1* | 3/2015 | Moschner et al. | 438/72 |

FOREIGN PATENT DOCUMENTS

| | | |
|---|---|---|
| DE | 102009044052 A1 | 3/2011 |
| DE | 102010016992 A1 | 11/2011 |
| DE | 102010017461 A1 | 12/2011 |
| DE | 102010037355 A1 | 3/2012 |
| EP | 1221496 A1 | 7/2002 |
| EP | 2031659 A1 | 3/2009 |
| EP | 2070128 B1 | 12/2010 |
| WO | 9931714 A1 | 6/1999 |
| WO | 2006/096247 A2 | 9/2006 |
| WO | 2007/022955 A1 | 3/2007 |
| WO | 2008101106 A2 | 8/2008 |
| WO | 2010105585 A1 | 9/2010 |
| WO | 2011080661 A1 | 7/2011 |
| WO | 2011133965 A2 | 10/2011 |

OTHER PUBLICATIONS

Non-English Action with Search Report dated Nov. 17, 2015 for Chinese Application No. 201380010618 and English translation.

espacenet English abstract of WO 2007/022955 A1.

Zhao, J., et al., "Performance Instability in N-Type Pert Silicon Solar Cells", $3^{rd}$ World Conference on Photovoltaic Energy Conversion, May 11-18, 2003, pp. 923-926.

Swanson, R., et al., "The Surface Polarization Effect in High-Efficiency Silicon Solar Cells", Proceedings of the $15^{th}$ International Photovoltaic Science &Engineering Conference, 2005, 4 pages.

Welter, P., "Zu gute Zellen", Photon, Apr. 2006, p. 102.

Rutschmann, I., "Noch nicht ausgelernt", Photon, Jan. 2008, pp. 122-123.

Rutschmann, I., "Polarisation überwunden", Photon, Aug. 2008, pp. 124-125.

* cited by examiner

METHOD FOR PRODUCING A SOLAR CELL

This application is a 371 of PCT/EP2013/053515, filed on Feb. 22, 2013, which claims priority to German Application No. 102012101456.6, filed Feb. 23, 2012.

The invention relates to a method for producing a solar cell with a substrate consisting of silicon with a dielectric passivation layer present on the surface of the substrate, in the form of a silicon oxide layer and of a layer applied thereon, such as an antireflection layer, such as a silicon nitride or silicon oxynitride layer, which is deposited in a processing space, preferably by means of a PECVD process, on the dielectric passivation layer.

Solar cells made of crystalline silicon are typically constructed so that a silicon wafer with base doping is used, into which doping is introduced at least on the front surface intended for the light irradiation, wherein the doping substance concentration exceeds the base doping. This occurs by means of doping of a type opposite that of the base doping, if the solar cell has a transmitter for charge carrier separation on the front surface. If the charge carrier separation occurs on the back surface, a so-called "front surface field" is formed on the front surface by means of the same doping type. The highly doped area as a rule is relatively flat with typical depths of a few tenths of a micrometer to a few micrometers. As a rule, these solar cells have a coating of the front surface, which is used for the surface passivation. This layer, or an additional layer applied thereon, is used, in addition, as antireflection layer.

As a rule, many solar cells are series connected using metal connectors and laminated in a solar module consisting of several insulation layers, in order to protect them from weathering influences. One problem is that, as a result of the series connection of the solar cells and the series connection of several modules so as to form one system, system voltages of several hundred volts occur on a regular basis. This results in strong electrical fields between solar cells and ground potential, leading to undesired displacement currents and discharge currents. As a result, charges can be deposited permanently on the surface of the solar cells, and they can considerably reduce the efficiency of the said solar cells. Under illumination or during long-term storage in darkness, charges can also accumulate on the surface.

The degradation of the open circuit voltage and to a lesser extent also of the short circuit current due to charges on the front surface of bilaterally contacted silicon solar cells with n-type base doping and p-doped front surface is known (J. Zhao, J. Schmidt, A. Wang, G. Zhang, B. S. Richards and M. A. Green, "Performance instability in n-type PERT silicon solar cells," Proceedings of the 3rd World Conference on Photovoltaic Solar Energy Conversion, 2003). The open circuit voltage and the short circuit current strongly degrade under illumination and during long-term storage in darkness. The accumulation of positive charges in the silicon nitride and/or silicon oxide on the front surface has been identified as reason for the degradation. They lead to depletion of the silicon surface and thus to an increase in the surface recombination speed for minority charge carriers. It is characteristic that, as a result, the parallel resistance and thus the fill factor are not affected.

The degradation of the open circuit voltage and of the short circuit current due to charges on the front surface and also in the case of bilaterally contacted silicon solar cells with n-type base doping, n-doped front surface, and p-doped back surface has been observed (J. Zhao, ibidem). They also strongly degrade under illumination and during long-term storage in darkness due to accumulation of negative charges in the silicon nitride and/or silicon oxide on the front surface.

In this case, the negative charges lead to depletion of the n-doped silicon surface and therefore again to the increase of the surface recombination speed. In this case as well, it is characteristic that the parallel resistance and thus the fill factor are not affected.

For modules containing back-surface contacted solar cells with n-type base doping, n-doped front surface and local p- and n-doped areas on the back surface of the substrate, a degradation due to charges is known (see: R. Swanson, M. Cudzinovic, D. DeCeuster, V. Desai, J. Jürgens, N. Kaminar, W. Mulligan, L. Rodrigues-Barbosa, D. Rose, D. Smith, A. Terao and K. Wilson, "The surface polarization effect in high-efficiency silicon solar cells," Proceedings of the 15th International Photovoltaic Science & Engineering Conference, p. 410, 2005; Hans Oppermann, "Solar-zelle," Patent Application WO 2007/022955 as well as Philippe Welter, "Zu gute Zellen," Photon, p. 102, April 2006). If these modules have a high positive potential with respect to ground, then negative charges migrate to the front surface of the solar cells where no contacts are applied. There, due to the low electrical conductivity of the composite material of the module, said negative charges can persist for a long time, even after switching off the system voltage. As a result, the surface recombination speed on the front surface is increased and thus the open circuit voltage and the short circuit current are reduced. Interestingly, a reduction of the fill factor has also been reported. No degradation occurs if the positive terminal of the system is grounded, i.e., if from the beginning on only negative system voltages are allowed. Clearly, positive charges on the front surface of this solar cell type thus do not lead to degradation. If degradation has occurred already due to negative charges on the front surface, then, by repolarization of the system voltage in darkness or overnight, i.e., by applying a high negative potential compared to ground, the degradation can be reversed temporarily (regeneration by means of compensation voltage). Here, the negative charges are discharged from the surface of the solar cells. However, degradation resumes again the next day due to high positive system voltage, so that the regeneration has to be carried out anew each night.

Furthermore, in R. Swanson, ibidem, for the purpose of preventing the accumulation of charges on the front surface of solar cells in which all the pn transitions and metal contacts are located on the back surface of the substrate, it has been proposed to apply a conductive coat on the antireflection layer on the front surface, and to conductively connect this coat to the plus or minus terminal of the solar cells on the back surface.

Bilaterally contacted silicon solar cells with p-type base doping and n-doped front surface are substantially less sensitive to changes of the surface recombination speed on the front surface, compared to the above-described solar cell types. Therefore, under illumination and during long-term storage in darkness, only a slight degradation of the open circuit voltage has been observed (J. Zhao, ibidem).

In Ines Rutschmann, "Noch nicht ausgelernt," Photon, p. 122, January 2008 and Ines Rutschmann, "Polarisation überwunden," Photon, p. 124, August 2008, a description is provided showing that modules with bilaterally contacted silicon solar cells with p-type base doping and n-doped front surface, after exposure to high negative system voltages, have low parallel resistances and thus also low fill factors. This is a sign of an interaction between transmitter and base and thus in principle different from the above-described influences on the surface recombination speed. By treatment at increased temperature and high humidity, the degraded modules in part recovered their performance ability. At high positive system voltages, no degradation was observed and already degraded modules were successfully regenerated temporarily by applying a high positive potential with respect to ground in darkness, i.e., a generation by means of compensation voltage is also possible in this case, but with reverse polarization as in the above-described modules which contain solar cells contacted on the back surface and with n-type base doping, n-doped front surface, and local p- and n-doped areas on the back surface of the substrate. In the case of high negative system voltages, the degradation resumes, so that the regeneration by means of compensation voltage also has to be repeated regularly in this case.

Furthermore, it is reported that the degradation of the modules at high negative system voltages is caused by the front-side metallization method used, by a special transfer pressure (see Rutschmann, ibidem).

A test for the PID-stability of solar modules is currently being established. The test conditions provide that a voltage of −1000 V is applied to modules from on-going series production over seven days. In order to obtain exact comparison values, all the modules are covered with aluminum foil and tested at constant 25 degree Celsius. A module is considered to be resistant against PID, if it loses less than 5% power compared to the nominal power over this time period.

Solar cells made of crystalline silicon today are provided practically exclusively with a front surface coating made of silicon nitride (SiN), which is used both for the electronic passivation of the surface and also as antireflection layer. It is known that, by means of a thermal oxidation of the surface, the passivation can be reduced by lowering the boundary surface state density. To achieve this effect, the oxidation is carried out in ultrapure furnaces after separate cleaning of the silicon wafer. However, as a rule, this oxidation is not used in industrial processes, because of the associated costs and cleanliness requirements.

The deposition of the SiN layer occurs as a rule by plasma-enhanced chemical vapor deposition (PECVD), since, in the process, at temperatures of typically 200 . . . 500° C., a layer which contains an adjustable hydrogen content that can be optimized for the passivation effect of the layer can be generated cost effectively. As a rule, the deposition occurs in a vacuum.

Different types of coating installations can be distinguished: in so-called batch installation, a group of wafers is introduced into a processing chamber in which a time-controlled deposition process occurs, during which the wafer is at rest. Here, the processing chamber can be vented for the replacement of the wafers, or an upstream airlock chamber is used, which is alternately vented and evacuated, while the processing chamber remains evacuated. In the first case, the wafers are heated by the heating device of the processing chamber to the required temperature. In the last case, as desired, the same chamber can be used for introducing and removing the wafers through an airlock or two different chambers are used. The heating of the wafers as a rule occurs here in the airlock chamber or in an additional area located between airlock and processing chamber; a heating of the wafers outside of the airlock chamber is also possible.

In so-called inline installations, on the other hand, the coating process is as a rule maintained continuously in a processing zone in a vacuum, while wafers—as a rule on wafer carriers (carriers)—are cyclically introduced and removed through an airlock. With regard to the heating process, the statements made above apply, except that the option of heating in the processing zone is eliminated. According to the prior art, such installations are designed so that the airlock chambers can be evacuated very rapidly for reasons pertaining to throughput, so that, if heating of the wafers in the airlock chamber occurs, a temperature of, for example, 400° C. can be reached only if the pressure and in particular the oxygen partial pressure are already very low.

Before the deposition of the passivation/antireflection layer, the silicon substrates are usually subjected to several chemical processes. One absolutely necessary step is the removal of the superficial glass layer which forms during the diffusion, such as phosphorus silicate glass or boron silicate glass. For this purpose, dilute hydrofluoric acid is used. After treatment in dilute hydrofluoric acid, the silicon surface is hydrophobic. Optionally, chemical edge insulation can be carried out, by removing undesired doped areas by means of an etching solution consisting usually of nitric acid and hydrofluoric acid.

In addition, transmitter etching and cleaning solutions can be used. The oldest known solutions which are used here are the solutions that are already used in the RCA cleaning used in the semiconductor industry. The RCA cleaning sequence contains the following process steps: an alkaline solution made of ammonia and hydrogen peroxide ("SC-1"), an acidic solution made of hydrochloric acid and hydrogen peroxide ("SC-2"), and treatment in dilute hydrofluoric acid.

Cleaned hydrophobic substrates oxidize slowly in the air (native oxide), within minutes to hours, and the silicon surface becomes hydrophilic; the resulting silicon oxide layer has a thickness of only approximately 1 nm.

A targeted and controlled hydrophilization of the surface can also be achieved by chemical oxidation, by treating the substrate in solutions with an oxidation agent such as hydrogen peroxide, ozone or nitric acid. The resulting oxide layers have a thickness of approximately 1.5 nm.

The solar cells produced according to the prior art have the disadvantage that the layers applied to the front surface under operating conditions can take up electrical charges which affect the operation of the solar cell and lead to a reduced output of the solar modules based thereon. This is particularly the case if the solar modules are brought to high negative voltages relative to ground. The yield reduction can here be more than 90% of the power. This phenomenon is known as "potential induced degradation" (PID). It has been found that "natural" as well as chemical oxidation of the solar cell surface before the antireflection coating tend to reduce the degradation; however, in general it is not possible to prevent said degradation sufficiently so that the efficiency of the solar module is not affected.

EP-B-2 070 128, US-A-2009/0260673, WO-A-2006/096247 and US-A-2010/0307562 disclose solar cells with a silicon wafer, comprising on the surface a dielectric passivation layer in the form of an oxide layer, and on said layer an antireflection layer made of silicon nitride, which is deposited in the PECVD process. The dielectric passivation layer, which can have a thickness of 10 Å to 25 Å, is formed either by thermal oxidation (EP-B-2 070 128) or by immersion in an ozone-containing deionized water (US-A-2009/0260673, WO-A-2006/096247 and US-A-2010/0307562). Here, the possibility also exists of forming the dielectric passivation layer only in some areas using a lithography process.

From US-A-2010/0029038, a method for producing a solar cell is known, in which a solar cell substrate is fed into a processing chamber which contains a gas mixture of argon and oxygen and in which a plasma is ignited. In the process, a silicon oxide film forms on the substrate.

According to WO-A-2011/080661, a silicon substrate is subjected to a preliminary treatment in a plasma, wherein the substrate oxidizes.

The production of a solar cell is the subject matter of US-A-2011/0240114. Here, the substrate, which contains a precursor gas, is exposed to a plasma in order to form a silicon oxide layer.

In order to form a $SiO_2$ layer on a solar cell substrate, thermal oxidation is provided according to US-A-2010/0275965.

In EP-A-2 031 659, an inline process for producing pressure contacts of solar cells is described.

WO-A-99/31714 provides for a preliminary processing of a wafer in an airlock chamber.

The present invention is based on the problem of further developing a method of the type mentioned in the introduction so that stability of the solar cells or of the solar cell modules produced therefrom against potential induced degradation (PID) is achieved. Here, the method should be such that it can be implemented without substantial changes in industrial production, without leading to a high cost burden. Additional installations, in particular processing spaces, should not be required.

To solve the problem, the invention provides a method for producing a solar cell with a substrate consisting of silicon with a dielectric passivation layer which is present on the surface of the substrate and in the form of a silicon oxide layer and of an antireflection layer applied thereon, which is deposited in a processing space, preferably by a PECVD process, on the dielectric passivation layer, wherein the dielectric passivation layer is formed from the surface of the substrate in the processing space by means of an at least partially dissociated, oxidizing gas, such as by means of a plasma containing an oxidizing gas, or the dielectric passivation layer is formed from the surface of the substrate in a preliminary processing space upstream of the processing space, in the presence of an oxidizing gas, wherein the substrate in the preliminary processing space is exposed to a temperature T where $T \geq 250°$ C., in particular $T \geq 400°$ C., for a time t at an oxygen partial pressure of at least 100 Pa, in particular at least 1 kPa, wherein, before manufacturing the dielectric passivation layer, the surface of the substrate is provided with hydrophilic properties.

The term plasma is used below as a summary term for an at least partially dissociated, oxidizing gas as well as a plasma containing the oxidizing gas.

According to the invention, stability against potential induced degradation can be achieved in that the silicon oxide layer is formed from the surface of the silicon substrate in the plasma. Thus, the components of a batch installation by means of which the required antireflection layer is deposited can be used without changes. A targeted oxidation in the plasma occurs, as a result of which defined layer thicknesses of the dielectric passivation layer, that is to say of the silicon oxide layer, can be achieved. For this purpose, in the processing space, an oxidizing gas is introduced in a targeted manner.

However, the scope of the invention is also not exceeded if the oxidizing gas, in addition, contains silane. By this means, a silicon oxide layer deposits on the surface of the substrate.

However, there is also the possibility of a targeted thermal oxidation, which can be carried out in an existing inline installation, wherein, by means of targeted process control in the preliminary processing space, which can be the airlock space or the airlock chamber, which is upstream of the processing space, the desired thickness of the dielectric passivation layer can be formed from the surface.

The dielectric passivation layer is preferably formed substantially from the surface of the substrate. Here, there is substantially a so-called "grown" layer—in contrast to a deposited layer. In particular, it is advantageous to form the dielectric passivation layer exclusively from the surface of the substrate.

The dielectric passivation layer preferably has a thickness D greater than 0.3 nm, in particular greater than 0.5 nm, in order to ensure sufficient stability against PID. In order not to affect additional properties of the solar cells, the dielectric passivation layer preferably has a thickness D smaller than 125 nm, particularly smaller than 25 nm, in particular smaller than 3 nm.

In particular, it is advantageous for the silicon oxide layer to have a thickness D where $0.5\ nm \leq D \leq 3\ nm$.

The subject matter of the invention consequently is the further development of known methods for producing silicon solar cells, in such a way that the boundary surface between doped areas and the antireflection coating is modified in such a manner that stability of the solar cell against potential induced degradation (PID) is achieved, wherein the equipment expense is minimized. PID is a degradation of the power of the solar cell which occurs when said solar cell is exposed in a system to a high voltage relative to ground potential.

In the known installations, the substrate to be processed is arranged on a carrier and then fed to the processing space. According to the invention, in a variant, it is provided that the substrate on the carrier is heated in the preliminary processing space, in particular in the airlock space, and exposed to an oxidizing atmosphere. Here, as oxidizing atmosphere or oxidizing gas, it is preferable to use such an oxidizing atmosphere or oxidizing gas wherein the oxygen partial pressure is at least 100 Pa, preferably at least 1 kPa, preferably at least 5 kPa.

As oxidizing gas, oxygen, dinitrogen monoxide, ozone or mixtures thereof can be used. Furthermore, as mentioned, there is the possibility of adding silane to the oxidizing gas, so that a silicon oxide layer is deposited.

In the case of formation of the dielectric passivation layer from the surface of the substrate in a preliminary processing space upstream of the processing space, it is particularly advantageous if the substrate is exposed in the preliminary processing space to a temperature T where $T \geq 300°$ C., more preferably $T \geq 350°$ C., in particular $T \geq 400°$ C.

In particular, it is advantageous that the substrate, that is to say the wafer, is heated in the preliminary processing space, such as an airlock space, to a temperature of at least 400° C., in particular between 400° C. and 800° C., and exposed for a time t to the oxidizing atmosphere or to the oxidizing gas. Here the time period should be between 2 s and 60 s.

For the generation of the hydrophilic properties, the substrate can be treated with an alkaline or acidic solution with an oxidation agent. As alkaline component of the alkaline solution, one can consider using at least one component from the group of NaOH, KOH, tetraalkylammonium hydroxide, such as tetramethylammonium hydroxide. For the acidic solution, methanesulfonic is to be preferred. As oxidation agent it is preferable to provide an element from the group of percarbonates, perborates, peroxomonosulfates, peroxodisulfates, hypochlorite.

Independently thereof, the possibility exists for the alkaline solution to contain, in addition to the oxidation agent, additional components such as stabilizers, complexing agents or surfactants.

According to the invention, for the production of a PID-stable solar cell, the formation or the application of a thin oxide layer on the solar cell front side before the deposition of the antireflection layer is proposed. Here, as oxide layer, the formation or the application of a thin oxide layer on the solar cell front side before the deposition of the antireflection layer is proposed. Here, the thickness of the oxide layer, that is the dielectric passivation layer, should be a thickness between 0.5 nm and 3 nm. Depending on the selected coating method for the antireflection layer, the layer can be applied differently, without fundamentally requiring changes in the construction of the installation for depositing the antireflection layer.

If the coating of the solar cell front side is carried out in a batch installation, then the oxidation is carried out by brief ignition of a plasma in an atmosphere with an oxidation agent, such as dinitrogen monoxide or oxygen. Alternatively, the deposition of a silicon oxide layer can occur by means of a plasma of a gas mixture of silane and an oxidation agent.

These processes can be carried out with little additional expenditure of time in a coating installation corresponding to the industrial standard.

If the coating occurs in a so-called inline installation, in which the transport of the wafer occurs through airlocks in a permanently evacuated processing area, then the oxidation of the wafer occurs by heating in air or in another oxygen-containing atmosphere before the deposition of the antireflection layer. Preferably, the wafers, if they are placed on a wafer carrier for the transport in the installation, are heated while they are still in the air. It is also possible to use the evacuation phase of the airlock chamber, while there is still a residual air pressure in the chamber. Here, the wafers are heated before or during the airlock process; for this purpose, the airlock chamber is preferably vented with air or a nitrogen/oxygen mixture. The temperature during the oxidation must or should be above 250° C. In order not to reduce the throughput of the installation due to the time required for the oxidation, it is possible to carry out the airlock introduction process in two steps, so that the first, outer airlock in which the oxidation occurs does not have to be evacuated to the lower coating pressure; instead, it needs to be evacuated only to a higher transfer pressure. In an inner airlock, an evacuation is then carried out to the required base pressure, before the wafer carrier is transferred into the processing chamber.

However, when installations are used wherein, before the introduction of the substrates into the processing space, the antireflection layer is deposited by the PECVD process in the airlock space upstream of the processing space, there is also the possibility of generating the vacuum, that is of pumping out the air, after a temporal delay, so that the substrate can be exposed for the required duration to an oxygen-containing atmosphere at a temperature T where T≥250° C., in order to form the desired oxide layer as the dielectric passivation layer, wherein the parameters have to be adapted to one another so that the oxide layer has a thickness greater than 0.3 nm, preferably between 0.5 nm and 3 nm.

If a coating installation is used in which a batch process is combined with separate airlocks, then the two methods can be combined. Here, as a rule, the airlock introduction occurs in a single step.

By sufficiently strong oxidation of the surface, the method described according to the invention can be used to achieve the PID stability of the solar cells produced against PID. The oxidation parameters here can be adapted in such a manner that a possibly observed residual degradation does not affect the efficiency of the solar module. No additional installations for oxidation are needed, since the silicon wafer on the workpiece carrier (carrier, palette, boot, etc.), which is required in any case for the surface coating process, is subjected to the oxidation. It has been shown that for stability against PID the decisive factors are not only the layer thickness, but particularly the layer production parameters.

In the case of formation of the dielectric passivation layer from the surface of the substrate in the process space by means of an at least partially dissociated, oxidizing gas, preferably by means of a plasma containing an oxidizing gas, the formation of the layer applied on the dielectric passivation layer occurs preferably in the same processing space.

The layer applied to the dielectric passivation layer is preferably formed as an antireflection layer.

The layer applied to the dielectric passivation layer is preferably formed as a layer from the group consisting of silicon nitride layer, silicon oxinitride layer, silicon oxide layer, aluminum oxide layer, aluminum nitride layer, titanium oxide layer, particularly preferably as a layer system comprising at least two layers, preferably comprising at least one of the above-mentioned layers.

It is preferable for the layer applied to the silicon oxide layer to be designed so that it contains hydrogen.

Preferably, the layer applied to the silicon oxide layer is deposited by means of a PECVD process.

In the case of formation of the layer applied on the dielectric passivation layer in the same processing space used for the formation of the dielectric passivation layer, it is preferable for the layer applied on the dielectric passivation layer to be formed as a layer from the group consisting of silicon nitride layer, silicon oxinitride layer, aluminum oxide layer, aluminum nitride layer, titanium oxide layer or titanium layer, particularly preferably by PECVD.

In the case of formation of the dielectric passivation layer from the surface of the substrate in a preliminary processing space upstream of the processing space, it is particularly advantageous to form the layer applied to the dielectric passivation layer as a layer from the group consisting of silicon nitride layer, silicon oxinitride layer, aluminum oxide layer, aluminum nitride layer or titanium layer, preferably by means of a CVD process.

The subject matter of the invention is also a solar cell which is produced by the method according to the invention, wherein the dielectric passivation layer located on the front surface has a thickness greater than 0.3 nm, preferably greater than 0.5 nm. Preferably, the thickness is less than 120 nm, particularly preferably less than 25 nm, and more preferably the layer thickness is between 0.5 nm and 3 nm.

Further details, advantages and features of the invention can be obtained not only from the claims, the features that can be obtained from them—individually and/or in combination—, but also from the following description of preferred embodiment examples.

Figure 1:
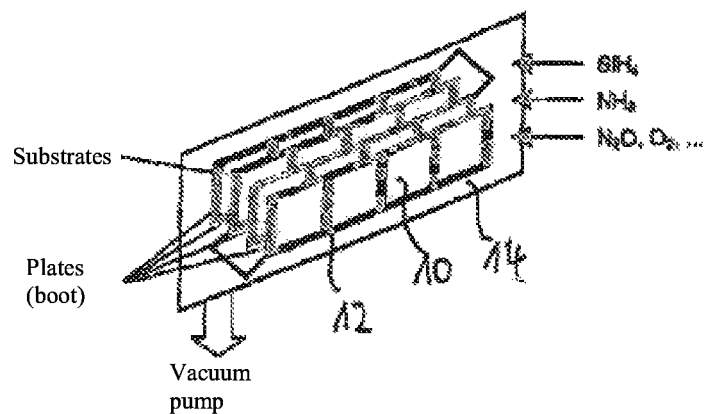
FIG. 1 shows a basic representation of a batch PECDV reactor.

The figures provide a basic illustration showing that the controlled formation according to the invention of a dielectric passivation layer can occur on the surface extending on the front side of a silicon substrate 10 can occur in a coating installation 14, which can be a batch PECVD reactor according to the prior art, in which an antireflection layer is deposited, usually on the front side of a silicon wafer. For this purpose, in the usual manner, a so-called boot is used, which consists of a number of parallel plates as carrier 12, which are alternately electrically connected and which are used as electrodes for the plasma generation in the PECVD installation. The silicon substrates 10 are placed on these plates and they are brought with the plate arrangement into the coating installation (FIG. 1). Here, the surface forming the back side in the finished solar cell lies on the carrier or on the plates 12, so that they are covered in the plasma process to be carried out.

After feeding the carriers 12 into the processing space 14 and evacuating the process space 14, an oxidizing gas is ignited. The oxidizing gas to be ignited can contain oxygen, dinitrogen monoxide, ozone or mixtures thereof.

As a result of the plasma containing the oxidizing gases which are thus obtained, a silicon oxide layer forms on the surface of the substrates 10, by means of which stability of the finished solar cell against potential induced degradation can be achieved.

If applicable, the oxidizing gas can contain silane, so that, in addition to the formation of the dielectric passivation layer from the surface, deposition of a silicon oxide layer also occurs.

Subsequently, the gas atmosphere is replaced in order to expose the substrates 10 to a plasma so as to deposit the desired antireflection layer, such as silicon nitride or silicon oxinitride layer. For this purpose, $SiH_4$ or $NH_3$ is fed into the processing space 14, as symbolized by the arrows in FIG. 1.

In other words, a coating installation is used which comprises at least one heated processing space 14 which can be evacuated and in which the coating process is carried out. The plate arrangement with the substrates 10 located thereon is first heated; at the same time or later, the processing space 14 is evacuated. According to the prior art, first a plasma with oxide-reducing or chemically neutral gases can be ignited, in order to condition the substrate surface. According to the invention, an oxidizing gas or gas mixture is then introduced into the processing space 14 and a plasma is ignited. As a result, a silicon oxide layer is formed on the surface of the substrate 10.

There is also the possibility of admixing silane with the oxidizing gas, so that a silicon oxide layer is deposited from the gas phase.

One can see that the installation structure of an installation for producing solar cells is unchanged, since the processing space 14 used for the deposition of the antireflection layer, also referred to as reactor, is also used for the formation or deposition of the dielectric passivation layer in the form of the silicon oxide layer. Here, the term silicon oxide layer also covers a dielectric passivation layer which contains silicon oxide.

Figure 2:
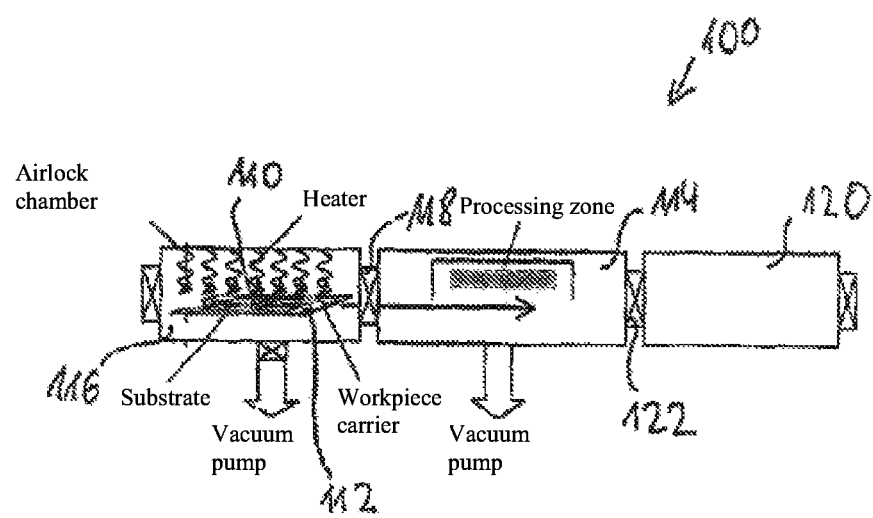
FIG. 2 shows a basic representation of an inline PECVD installation.

In FIG. 2, a simple basic representation of an inline PECVD installation 100 is shown, as used for the production of solar cells. The processing space 114 is preceded by an airlock chamber 116 which is referred to as preliminary processing space and which has to be evacuated after the introduction of substrates 110 placed with their back sides on a carrier 112, in order to be able to feed the carrier 112 with the substrates 110 into the processing space 114 which is under a vacuum.

According to the invention it is provided that, before the evacuation of the airlock chamber 116, that is to say the preliminary processing space, a dielectric passivation layer is formed according to the invention by thermal oxidation from the surface of the substrates 110, that is to say a silicon oxide layer is generated. For this purpose, the substrates 110 are heated in the preliminary processing space to a temperature T of at least 400° C., in order then to be exposed in an oxidizing atmosphere such as air or an oxidizing gas, which can contain oxygen, dinitrogen monoxide, ozone or mixtures thereof, for a time t of at least 2 s. The time period should not exceed 60 s here. During this time, the desired dielectric passivation layer forms by thermal oxidation on the front-side surface of the substrates 110.

The silicon substrates 110 are therefore placed on a planar workpiece carrier 112 which is used for transporting the substrates 110 through a coating installation 100. The workpiece carrier 112 is transported into the airlock chamber 116 of the coating installation 100, in which the workpiece carrier 112 and the substrates 110 are heated. In the process, the evacuation process can be started in the airlock chamber, that is to say the preliminary processing space 116, after the substrate temperature has exceeded a value of 400° C. (Example 1 in FIG. 3), or the evacuation process takes place so slowly that this temperature is reached while the oxygen partial pressure is still sufficiently high so that oxidation of the substrate surface is achieved, that is to say, for example, higher than 1 kPa (Example 2 in FIG. 3). As a result, an oxygen partial pressure of more than 1 kPa at a substrate temperature of more than 400° C. is maintained for a period of several seconds.

Figure 3:
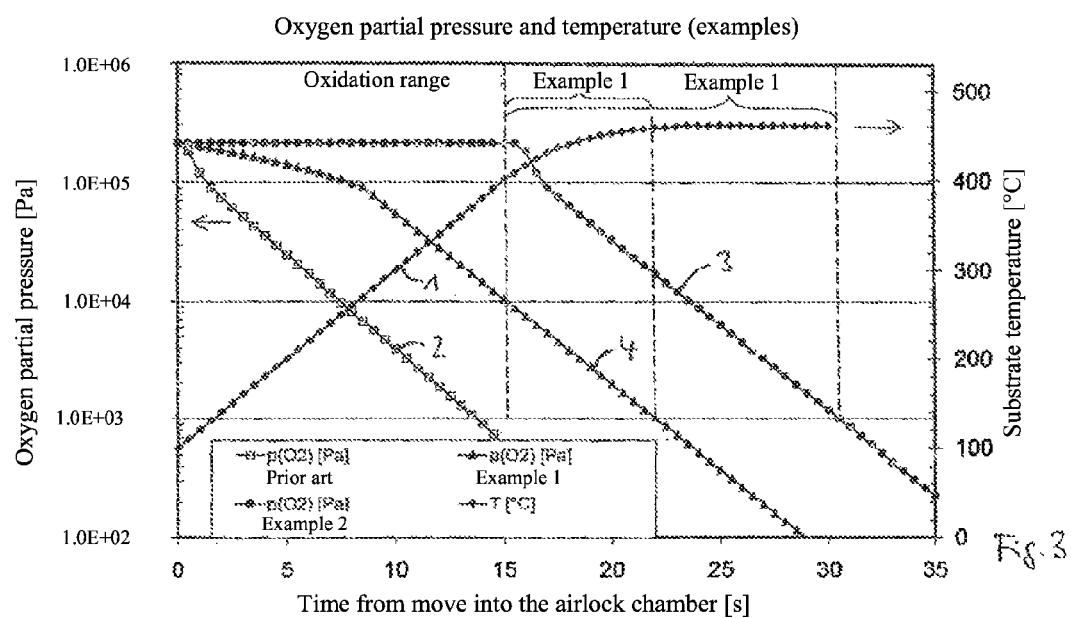
FIG. 3 shows a temperature-oxygen partial pressure curve in a preliminary processing chamber.

The corresponding conditions can be seen in FIG. 3. Thus, curve 1 represents the temperature course in the preliminary processing space 116 in which, after the introduction of the substrates 110 on the workpiece carrier 112, the substrate 110 is heated to a temperature of more than 400° C. According to the prior art, evacuation of the preliminary processing space takes place at the same time. This is symbolized by curve 2.

One can then see that, when the temperature in the preliminary processing space is 400° C., the oxygen partial pressure is less than 1 kPa; that is to say that it has a value which is not sufficient for a defined thermal formation of a silicon oxide layer in order to form a silicon oxide layer having a thickness between 0.5 nm and 3 nm, in order to achieve in this way stability of a solar cell produced from the substrate against potential induced degradation.

In contrast, if evacuation of the preliminary processing space 116 occurs, according to the invention, only after the desired temperature for thermal oxidation has been reached, then it is ensured that the substrate is exposed for the required duration of at least 2 s to an oxidizing atmosphere by means of which the silicon oxide layer of desired thickness can form. This is illustrated by curve 3. However, the possibility also exists of delaying the evacuation process or to carry out the evacuation process sufficiently slowly so that the substrate 110 in the preliminary processing space 116 is exposed for the required period and at the required temperature to an oxidizing atmosphere, at which the oxygen partial pressure is more than 1 kPa, preferably more than 5 kPa, so that the silicon oxide layer can be formed from the surface of the silicon substrate 110. This is illustrated by curve 4.

After the evacuation, the carrier 112 with the substrates 110 is fed into the processing space 114 via an airlock 118. After an antireflection layer has been deposited in the processing space 114 in the usual manner by PECVD processes, the carrier 112 is transferred to an airlock chamber downstream of the processing space 112, after passing through an additional airlock 122. In that regard, reference is made to inline PECVD installations, which are sufficiently known so that there is no need for more detailed explanations.

The invention claimed is:

1. A method for producing a solar cell, the method comprising:
providing a silicon substrate;
forming a hydrophilic surface on the substrate by wet chemical oxidation;
providing a preliminary processing chamber;
providing a processing space downstream of said preliminary processing chamber;
forming a dielectric passivation layer from the hydrophilic surface of the substrate in the preliminary processing chamber, by exposing the substrate to a temperature $T \geq 250°$ C., for a time t, in the presence of an oxidizing gas with an oxygen partial pressure of at least 100 Pa; and
depositing an antireflection layer on the dielectric passivation layer in the processing space.

2. The method of claim 1, wherein the preliminary processing chamber is an airlock chamber.

3. The method of claim 1, wherein the oxygen partial pressure is at least 5 kPa.

4. The method of claim 1, wherein $400°$ C.$\leq T \leq 800°$ C., and $t > 1$ s.

5. The method of claim 1, wherein $2 \text{ s} \leq t \leq 60 \text{ s}$.

6. The method of claim 1, wherein the oxidizing gas is selected from the group consisting of oxygen, dinitrogen monoxide, and a mixture of oxygen and dinitrogen monoxide.

7. The method of claim 1, wherein the wet chemical oxidation is carried out by treating the substrate with an alkaline solution or an acidic solution.

8. The method of claim 7, wherein the alkaline solution comprises a compound selected from the group consisting of NaOH, KOH, tetraalkylammonium hydroxide, and a mixture thereof.

9. The method of claim 8, wherein the tetraalkylammonium hydroxide is tetramethylammonium hydroxide.

10. The method of claim 7, wherein the alkaline solution or the acidic solution further comprises an oxidation agent.

11. The method of claim 10, wherein the oxidation agent is selected from the group consisting of a percarbonate, a perborate, a peroxomonosulfate, a peroxodisulfate, and hypochlorite.

12. The method of claim 10, wherein the oxidation agent further comprises an agent selected from the group consisting of a stabilizer, a complexing agent, a surfactant, and a mixture thereof.

13. The method of claim 1, wherein the antireflection layer comprises hydrogen.

14. The method of claim 1, wherein the antireflection layer comprises a layer selected from the group consisting of a silicon dinitride layer, a silicon oxide layer, an aluminum oxide layer, an aluminum nitride layer, and a titanium oxide layer.

15. The method of claim 14, wherein the silicon dinitride layer is a silicon oxinitride layer.

16. The method of claim 1, wherein the antireflection layer comprises at least two layers.

17. The method of claim 7, wherein the acidic solution comprises methanesulfonic acid.

18. The method of claim 1, wherein the antireflection layer is deposited on the dielectric passivation layer using a PECVD process.

19. The method of claim 1, comprising feeding the substrate through the installation on a carrier.

20. The method of claim 1, wherein the dielectric passivation layer is a silicon oxide layer.

21. The method of claim 1, comprising providing the preliminary processing chamber and processing space in an inline installation.

22. The method of claim 1, wherein the wet chemical oxidation is carried out using an oxidation agent selected from the group consisting of hydrogen peroxide, ozone, and nitric acid.

23. The method of claim 1, wherein the oxygen partial pressure of the oxidizing gas is at least 1kPa.

* * * * *